United States Patent
Shmuel

(10) Patent No.: US 7,109,922 B2
(45) Date of Patent: Sep. 19, 2006

(54) RF SYSTEM CONCEPT FOR VEHICULAR RADAR HAVING SEVERAL BEAMS

(75) Inventor: Amir Shmuel, Nofit (IL)

(73) Assignee: Roadeye Flr General Partnership, Karmiel (IL)

( * ) Notice: Subject to any disclaimer, the term of this patent is extended or adjusted under 35 U.S.C. 154(b) by 87 days.

(21) Appl. No.: 10/508,716

(22) PCT Filed: Apr. 15, 2003

(86) PCT No.: PCT/IL03/00313

§ 371 (c)(1),
(2), (4) Date: Dec. 6, 2004

(87) PCT Pub. No.: WO03/090313

PCT Pub. Date: Oct. 30, 2003

(65) Prior Publication Data

US 2005/0122255 A1  Jun. 9, 2005

Related U.S. Application Data

(60) Provisional application No. 60/374,227, filed on Apr. 19, 2002.

(51) Int. Cl.
*H01Q 1/38* (2006.01)
*H04B 1/38* (2006.01)

(52) U.S. Cl. .................. 343/700 MS; 455/73; 455/81; 455/88; 343/772; 342/70

(58) Field of Classification Search ......... 343/700 MS; 455/73
See application file for complete search history.

(56) References Cited

U.S. PATENT DOCUMENTS 4,517,566 A   5/1985   Bryant et al.

(Continued)

FOREIGN PATENT DOCUMENTS

EP   0 498 524 A2   8/1992

(Continued)

OTHER PUBLICATIONS

I. Gresham, et al., A Compact Manufacturable 76-77-GHz Radar Module for Commercial ACC Applications, IEEE Transactions on Microwave Theory and Techniques, Jan. 2001, vol. 49, No. 1, pp. 44-58.

*Primary Examiner*—Trinh Vo Dinh
(74) *Attorney, Agent, or Firm*—Darby & Darby

(57) ABSTRACT

ABSTRACTA transceiver (20) for a millimeter wave signal, consisting of a PCB (140) having PCB microstrip lines (141) and PCB waveguide apertures (159), and one or more transmitter modules (22) and one or more receiver modules (24, 26, 28) mounted on the PCB. Each module has a single microstrip-waveguide transition (34, 48) and a microstrip-microstrip transition (47, 49). The microstrip-waveguide transition of each module couples to one of the PCB waveguide apertures via a PCB-module waveguide-waveguide transition (167). The microstrip-microstrip transition of each module couples to one of the PCB microstrip lines via a PCB-module microstrip-microstrip transition (165). The PCB-module transitions are low tolerance, facilitating implementation of the transceiver.

28 Claims, 6 Drawing Sheets

U.S. PATENT DOCUMENTS

| | | |
|---|---|---|
| 5,311,153 A | 5/1994 | Lau et al. |
| 5,606,737 A | 2/1997 | Suzuki et al. |
| 5,680,139 A | 10/1997 | Huguenin et al. |
| 5,825,333 A | 10/1998 | Kudoh et al. |
| 5,929,802 A | 7/1999 | Russell et al. |
| 5,959,569 A | 9/1999 | Khodabhai et al. |
| 5,969,580 A | 10/1999 | Maillet et al. |
| 6,115,584 A * | 9/2000 | Tait et al. .............. 455/73 |
| 6,522,304 B1 | 2/2003 | Ballantine et al. |
| 2003/0027530 A1* | 2/2003 | Levitt et al. ............ 455/73 |

FOREIGN PATENT DOCUMENTS

JP   2001-111310 A1   4/2001

* cited by examiner

RF SYSTEM CONCEPT FOR VEHICULAR RADAR HAVING SEVERAL BEAMS

CROSS-REFERENCE TO RELATED APPLICATION

This application claims the benefit of U.S. Provisional Patent Application 60/374,227, filed Apr. 19, 2002, which is incorporated herein by reference.

FIELD OF THE INVENTION

The present invention relates generally to transceiver design, and specifically to design of transceivers for millimeter wavelength waves for vehicular radars.

BACKGROUND OF THE INVENTION

Radar transceivers operating at millimeter wavelengths have been in use for some time on vehicles, where they are installed to provide such features as warnings of obstacles that may not be visible to a driver of the vehicle, or for autonomous cruise control (ACC). Because of their use in vehicles, the transceivers have to comply with a number of constraints, which taken together make it extremely difficult to implement a simple, efficient transceiver that is to be usable in a mass market environment.

Some of the constraints are inherent to operating with millimeter waves, which are typically transmitted in waveguides, microstrips, or by short wire bonds between components. The problems generated by the millimeter (mm) wavelengths include requirements for close tolerances for mm wave structures such as the waveguides, microstrip chip adhesion, and wire bonds. Failure to meet these requirements leads to unwanted reflections, cross talk between adjacent components, and/or absorption in the transceiver, with consequent degradation of received or transmitted signals. Typical cross-talk in adjacent mm wave receivers can be of the order of 15 dB or more.

Other constraints arise from the need to use the transceiver in a vehicle. Vehicular use requires that the transceiver be mechanically and electrically robust, be able to operate as an all-weather system, be relatively simple to construct, and preferably be relatively simple to maintain. The latter constraints are necessary in order to keep the cost of the transceiver to acceptable levels. The former constraints must be met so that the transceiver continues to function in the vehicle.

In an article titled "A Compact Manufacturable 76–77-GHz Radar Module for Commercial ACC Applications," by Gresham et al., in *IEEE Transactions on Microwave Theory and Techniques*, 49 (2001), the authors describe a transceiver module for a pulsed Doppler application. The module is switched between transmitting and receiving modes. In the receiving mode, the module operates, inter alia, a mixer which mixes received 76–77 GHz signals with local oscillator 76–77 GHz signals.

Modern vehicular radars typically require implementation of a multi-channel architecture. This leads to a complex multi-function front end. The complexity and stringent requirements on the transceiver lead to high cost solutions which limit the applicability of the technology.

There is thus a need for a low-cost, simple system for vehicular radar.

SUMMARY OF THE INVENTION

It is an object of some aspects of the present invention to provide a method and apparatus for transmitting and receiving signals at millimeter wavelengths.

In preferred embodiments of the present invention, a transceiver which transmits and receives millimeter (mm) waves comprises one or more transmitter modules and one or more receiver modules. Each transmitter module comprises active transmit components which are mounted on a transmit dielectric substrate and are configured so that the only coupling of the transmitter module that conveys mm wave signals is one microstrip-waveguide transition of the module. Each transmitter module also comprises a microstrip-microstrip transition for conveying low frequency signals. Each receiver module, which may operate in a heterodyne or a homodyne mode, comprises active receive components, including a mixer, which are mounted on a receive dielectric substrate, in a generally similar manner to the transmitter module. The active receive components are configured so that the only coupling of the receiver module that conveys mm wave signals is one microstrip-waveguide transition of the module. Each receiver module also comprises a microstrip-microstrip transition for conveying low frequency signals to the mixer.

The transceiver also comprises a printed circuit board (PCB) which is configured to accept the transmitter and receiver modules. For each module the PCB comprises a waveguide aperture which mates with a respective microstrip-waveguide transition to form a waveguide-waveguide transition to a mm wave transmit port in the case of transmitter modules, and a mm wave receive port in the case of receiver modules. The PCB also comprises microstrip lines which mate with respective microstrip-microstrip transitions of the modules to form microstrip-microstrip transitions to low frequency inlet ports.

Minimizing the number of couplings within the modules that are used in conveying and transferring mm waves eases the component tolerances required to produce transmitters and receivers with reproducible characteristics. Using similar construction methods for the transmitter and receiver modules facilitates the treatment needed for these components, and similarities of the overall design of the modules simplifies implementation of the transceiver. Furthermore, using only microstrip-microstrip transitions and waveguide-waveguide transitions for coupling the modules to the PCB, both types of transitions needing relatively low tolerances, considerably reduces assembly costs for the transceiver.

In some preferred embodiments of the present invention, at least some of the receiver modules comprise multiple sub-receivers. Each sub-receiver comprises one microstrip-waveguide transition connected to a respective mixer. The mixers receive a local oscillator (LO) low frequency input via the single microstrip-microstrip of the module. A single frequency generator provides a reference frequency for the LO low frequency, which mixers of all the modules use.

The active components of the modules most preferably use microwave integrated circuit (MIC) technology to simplify mounting of the components on their respective dielectric substrates. An optional mm wave short for each microstrip-waveguide transition preferably also uses MIC technology for its mounting. The transmitter and the receiver modules are most preferably implemented as surface mounted technology (SMT) components, so that their coupling to the PCB is facilitated.

There is therefore provided, according to a preferred embodiment of the present invention, a transceiver for a millimeter wave signal, including:

a printed circuit board (PCB), including PCB microstrip lines and PCB waveguide apertures;

one or more transmitter modules mounted on the PCB, each transmitter module including:

a single transmit microstrip-waveguide transition adapted to convey millimeter waves and coupled to one of the PCB waveguide apertures so as to form a transmit waveguide-waveguide transition;

a transmit microstrip-microstrip transition coupled to one of the PCB microstrip lines so as to form a PCB-transmitter module microstrip-microstrip transition; and transmit active components coupled to receive a first reference frequency from the PCB-transmitter module microstrip-microstrip transition, to generate the millimeter wave signal therefrom, and to transmit the millimeter wave signal via the transmit waveguide-waveguide transition; and one or more receiver modules mounted on the PCB, each receiver module including:

a single receive microstrip-waveguide transition adapted to convey millimeter waves and coupled to one of the PCB waveguide apertures so as to form a receive waveguide-waveguide transition;

a receive microstrip-microstrip transition coupled to one of the PCB microstrip lines so as to form a PCB-receiver module microstrip-microstrip transition;

an output port; and receive active components coupled to receive a second reference frequency from the PCB-receiver module microstrip-microstrip transition, to receive the millimeter wave signal from the waveguide-waveguide transition, to generate a down-converted signal in response to the second reference frequency and the millimeter wave signal, and to transfer the down-converted signal via the output port.

Preferably, the receive active components include:

a frequency multiplier that multiplies the second reference frequency to produce a sub-harmonic of a millimeter wave frequency; and a mixer that receives the millimeter wave signal and the sub-harmonic and generates the millimeter wave frequency therefrom as a local oscillator frequency, and that generates the down-converted signal in response to the local oscillator frequency and the millimeter wave signal.

Preferably, at least one of the receiver modules includes a second receive microstrip-waveguide transition adapted to convey millimeter waves and coupled to a second of the PCB waveguide apertures so as to form a second receive waveguide-waveguide transition.

Further preferably, the millimeter wave signal includes a first millimeter wave signal and a second millimeter wave signal, wherein the down-converted signal includes a first down-converted signal and a second down-converted signal, wherein the receive active components include:

a frequency multiplier that multiplies the second reference frequency to produce a sub-harmonic of a millimeter wave frequency;

a first mixer that receives the first millimeter wave signal and the sub-harmonic and generates the millimeter wave frequency therefrom as a local oscillator frequency, and that generates the first down-converted signal in response to the local oscillator frequency and the first millimeter wave signal; and a second mixer that receives the second millimeter wave signal and the sub-harmonic and generates the millimeter wave frequency therefrom as a local oscillator frequency, and that generates the second down-converted signal in response to the local oscillator frequency and the second millimeter wave signal.

The transceiver preferably includes a coupling between the frequency multiplier and the first and second mixers that rejects frequencies substantially similar to a frequency of the millimeter wave signal.

Preferably, at least one transmitter module is formed on a transmit dielectric substrate which retains the transmit active components, and at least one receiver module is formed on a receiver dielectric substrate which retains the receiver active components, and the transmit and receive dielectric substrates have substantially similar dimensions.

Preferably, at least one transmitter/receiver module includes:

a transmit/receive short adapted to act as a coherent reflector for the transmit/receive microstrip-waveguide transition; and a transmit/receive dielectric substrate which retains the transmit/receive active components and the transmit/receive short using microwave integrated circuit (MIC) technology.

At least one transmitter/receiver module preferably includes:

a transmit/receive dielectric substrate which retains the transmit/receive active components;

a transmit/receive microstrip line; and ground vias which penetrate the transmit/receive dielectric substrate, and wherein the transmit/receive microstrip-microstrip transition consists of the ground vias and the transmit/receive microstrip line.

At least one transmitter/receiver module preferably includes:

a transmit/receive dielectric substrate which retains the transmit/receive active components;

a transmit/receive waveguide opening in the transmit/receive dielectric substrate; and waveguide vias which penetrate the transmit/receive dielectric substrate, and wherein the transmit microstrip-waveguide transition consists of the transmit/receive waveguide opening and the waveguide vias.

At least one PCB waveguide aperture preferably includes:

a PCB waveguide opening in the PCB; and waveguide vias which penetrate the PCB and surround the PCB waveguide opening.

There is further provided, according to a preferred embodiment of the present invention, a method for transmitting and receiving a millimeter wave signal, including:

forming in a PCB PCB microstrip lines and PCB waveguide apertures;

mounting one or more transmitter modules on the PCB, each transmitter module including:

a single transmit microstrip-waveguide transition adapted to convey millimeter waves and coupled to one of the PCB waveguide apertures so as to form a transmit waveguide-waveguide transition;

a transmit microstrip-microstrip transition coupled to one of the PCB microstrip lines so as to form a PCB-transmitter module microstrip-microstrip transition; and transmit active components coupled to receive a first reference frequency from the PCB-transmitter module microstrip-microstrip transition, to generate the millimeter wave signal therefrom, and to transmit the millimeter wave signal via the transmit waveguide-waveguide transition; and mounting one or more receiver modules on the PCB, each receiver module including:

a single receive microstrip-waveguide transition adapted to convey millimeter waves and coupled to one of the PCB waveguide apertures so as to form a receive waveguide-waveguide transition;

a receive microstrip-microstrip transition coupled to one of the PCB microstrip lines so as to form a PCB-receiver module microstrip-microstrip transition;

an output port; and receive active components coupled to receive a second reference frequency from the PCB-receiver module microstrip-microstrip transition, to receive the millimeter wave signal from the waveguide-waveguide transition, to generate a down-converted signal in response to the second reference frequency and the millimeter wave signal, and to transfer the down-converted signal via the output port.

The present invention will be more fully understood from the following detailed description of the preferred embodiments thereof, taken together with the drawings, a brief description of which follows.

DETAILED DESCRIPTION OF PREFERRED EMBODIMENTS

Figure 1:
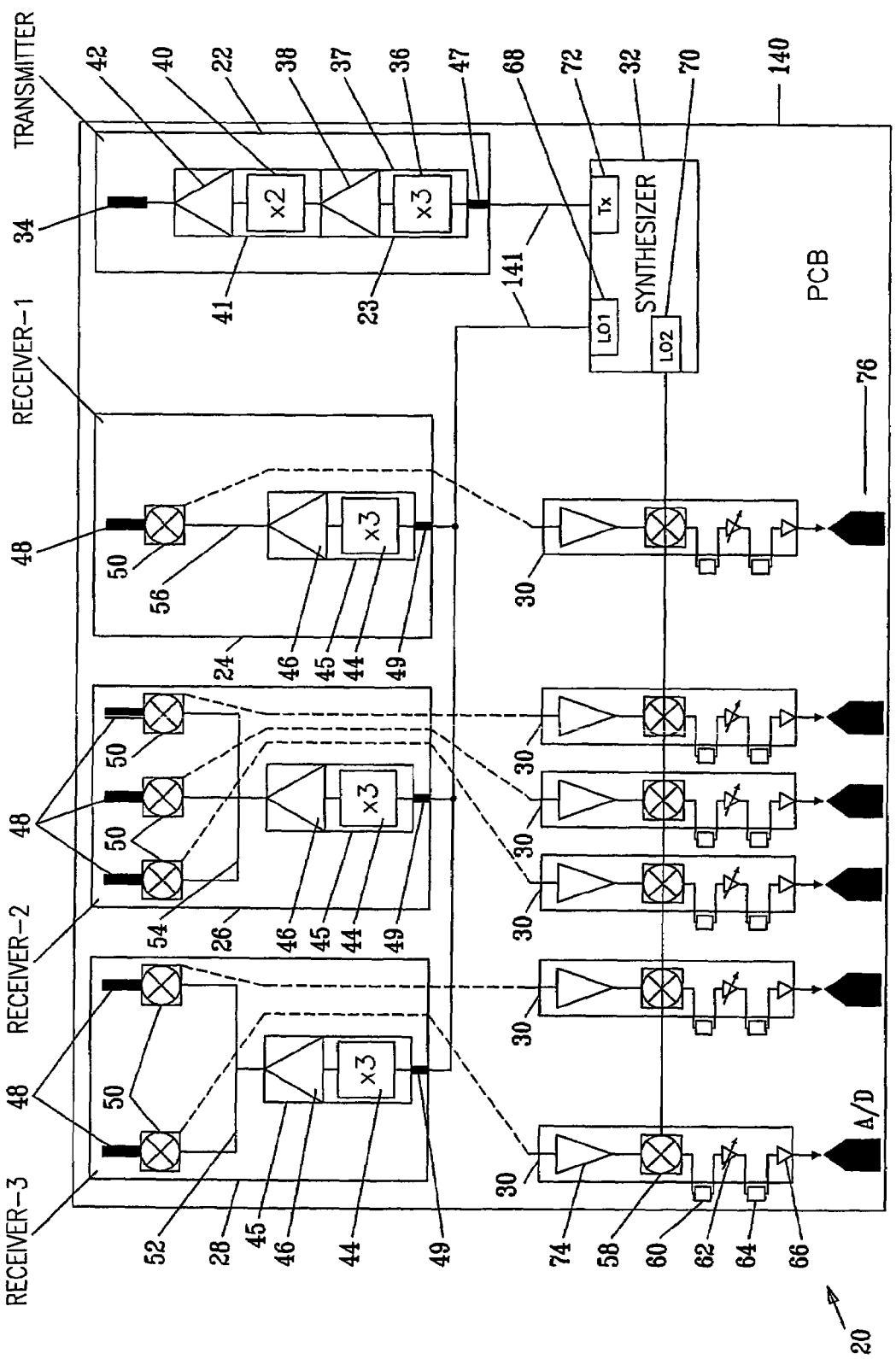
FIG. 1 is a schematic block diagram of a millimeter wave multiple beam transceiver, according to a preferred embodiment of the present invention.

Reference is now made to FIG. 1, which is a schematic block diagram of a millimeter wave multiple beam transceiver 20, according to a preferred embodiment of the present invention. Transceiver 20 comprises a transmitter module 22 which generates millimeter (mm) waves, at frequencies of the order of W-band, the mm waves being coupled to a transmitting antenna via a mm wave microstrip-waveguide transition 34, which acts as a mm wave output port. Herein, millimeter (mm) waves are assumed to be waves having frequencies of the order of W-band. In order to generate its mm waves, transmitter 22 receives a low frequency (LF) reference signal, at frequencies of the order of 12 GHz, from a frequency synthesizer 32. The LF signal is received via a microstrip-microstrip transition 47, which acts as an LF inlet port to transmitter module 22.

Transmitter 22 comprises a x3 frequency multiplier 36, a first amplifier 38, a x2 frequency multiplier 40, and a second amplifier 42, connected in series. Components 36 and 38 are incorporated into a first integrated circuit (IC) component 37. Components 40 and 42 are incorporated into a second IC component 41. IC components 37 and 41 are in turn mounted on a dielectric substrate 23, forming the base of a chip-scale package. Transmitter 22 is preferably implemented using microwave integrated circuit (MIC) technology. It will be understood that the only mm wave connection for transmitter 22 is for the output of the transmitter, via microstrip-waveguide transition 34 of the transmitter. A more detailed description of the physical layout and construction of transmitter module 22 is given below, with respect to FIGS. 3, 4 and 4. It will be understood that while transceiver 20 comprises one transmitter module 22, other transceivers having more than one transmitter module, generally similar to transmitter module 22, may be implemented. All such transceivers are assumed to be comprised within the scope of the present invention.

Transceiver 20 comprises a plurality of mm wave heterodyne receiver modules, each of which is constructed to receive one or more mm wave signals, or channels, from respective input ports, typically antennas, of the transceiver. By way of example, transceiver 20 is assumed to comprise three receiver modules 24, 26, and 28. Receiver 24 is constructed to receive one mm wave signal. Receivers 26 and 28 respectively comprise three sub-receivers and two sub-receivers of mm wave signals. It will be appreciated that the plurality of mm wave receiver modules in transceiver 20 may comprise substantially any number of receiver modules, and that each receiver module may have any suitable number of sub-receivers and corresponding input ports. Thus, for example, alternative arrangements for receiving six mm wave input signals could be two receiver modules each having three sub-receivers and their input ports, three receiver modules each having two sub-receivers and their input ports, or six receiver modules each having one input port.

Receiver module 24 comprises a x3 frequency multiplier 44 and an amplifier 46. Preferably, multiplier 44 and/or amplifier 46 are substantially similar in physical dimensions to multiplier 36 and amplifier 38, and are advantageously implemented as a single IC 45. Multiplier 44 receives a first LF signal (LO1) from synthesizer 32 via a microstrip-microstrip transition 49, which acts as an LF inlet port to receiver module 24, and which is implemented in substantially the same manner as microstrip-microstrip transition 47. The value of frequency LO1 is dependent on the output frequency transmitted by transmitter 22, as described in more detail below. An amplified output from amplifier 46, having a fundamental frequency, is fed to a mixer 50, preferably formed as an IC component, via a coupling line 56. Mixer 50 is also coupled to receive mm wave signals via a mm wave microstrip-waveguide transition 48, which acts as a mm wave input port, and which is implemented in substantially the same manner as microstrip-waveguide transition 34. Mixer 50 mixes its mm wave input with a harmonic, preferably a second harmonic, of the fundamental frequency of amplifier 46 so generating an intermediate frequency (IF) signal. Thus mixer 50 acts both as a mixer and as a harmonic generator, generating an LO mm wave frequency used by the mixer internally within the mixer. Because the fundamental frequency is a sub-harmonic of the LO mm wave frequency, unwanted radiation out of input port 48 is virtually eliminated.

Apart from the differences described below, the operation of receiver modules 26 and 28 is generally similar to that of receiver 24, such that elements indicated by the same reference numerals in receiver modules 24, 26, and 28 are generally identical in construction and in operation. Receiver modules 26 and 28 comprise three and two sub-receivers respectively, each sub-receiver having a respective mixer 50. As for receiver 24, each mixer 50 receives a mm wave signal via a respective mm wave microstrip-waveguide transition 48, and mixes its mm wave input with a harmonic of the fundamental frequency of amplifier 46 to generate a respective IF signal. For each receiver module the LO1 signal is input to the module via respective microstrip-microstrip transitions 49. Each mixer 50 receives the fundamental frequency via coupling lines 54 and 52, the coupling lines being constructed according to a number of mixers 50 in each receiver. Thus, coupling line 54 splits the output of amplifier 46 in receiver 26 to three mixers 50, and coupling line 52 splits the output of amplifier 46 in receiver 28 to two mixers 50.

As for receiver 24, each mixer 50 of receivers 26 and 28 acts both as a mixer and as a virtual harmonic generator for its respective channel, generating an LO mm wave frequency used by the mixer internally within the mixer. Furthermore, because mixers 50 operate with a fundamental frequency which is a sub-harmonic of the LO mm wave signals, the radio frequency LO isolation is very high, yielding very high cross-talk isolation between channels of the order of at least 30 dB.

The down-converted IF frequency generated by each mixer 50 is fed to a respective IF receiver block 30. Each receiver block 30 comprises an IF amplifier 74, which amplifies the output from its respective mixer 50, and feeds the amplified IF to a further mixer 58. Each mixer 58 receives a second LF signal (LO2) from synthesizer 32, LO2 acting as a local oscillator for the mixer, and generates substantially base-band signals. The base-band signals are transferred via filters 60 and 64, and amplifiers 62 and 66, to an analog-to-digital converter (A/D) 76, which provides a digital signal corresponding to the received signal at a respective mm wave input port In a preferred embodiment of the present invention, a frequency Tx input from synthesizer 32 to x3 multiplier 36 is swept around a center frequency of 12.75 GHz, so that the output of transmitter 22 is centered on 76.5 GHz. The value of LO1 is set so that the IF signal from mixer 50 is 2.4 GHz, so that LO1 is swept around (76.5−2.4)/6=12.35 GHz, and so that the fundamental frequency from amplifier 46 is swept around 37.05 GHz. To generate the base-band signals in receiver block 30, LO2 is set to the value of the IF signal from mixer 50, i.e., 2.4 GHz.

Modules 22, 24, 26, and 28, as well as receiver blocks 30, synthesizer 32, and A/D converters 76 are mounted on a printed circuit board (PCB) 140. PCB 140 is configured to have a respective waveguide aperture corresponding to each microstrip-waveguide transition 34 and 48. A more detailed representation of one such waveguide aperture is described below, with reference to FIG. 6. PCB 140 also comprises microstrip lines 141 which are configured on the PCB so as to provide input signals to transmitter module 22 and receiver modules 24, 26, and 28. Microstrip lines 141 feed the respective modules via microstrip-microstrip transitions 47 and 49.

It will be appreciated that transceiver 20 has only a single mm wave transmitter connection, i.e., microstrip-waveguide transition 34, and a single mm wave receiver connection per receiver or sub-receiver, i.e., microstrip-waveguide transition 48.

It will also be appreciated that modules 22, 24, 26, and 28, are formed in a generally similar manner, each having a minimal number of close tolerance microstrip-waveguide transitions. However, the microstrip-waveguide transitions of each module are coupled to waveguide apertures in PCB 140 by respective waveguide-waveguide transitions, and such waveguide-waveguide transitions may have substantially lower tolerances than microstrip-waveguide transitions without appreciable degradation of signals transferred via the waveguide-waveguide transitions. Thus, transceiver 20 may be implemented as a low-cost system by coupling modules 22, 24, 26, and 28 to PCB 140. Most preferably, modules 22, 24, 26, and 28 are implemented as SMT components, thus enabling the modules to be easily and accurately mounted on PCB 140.

Figure 2:
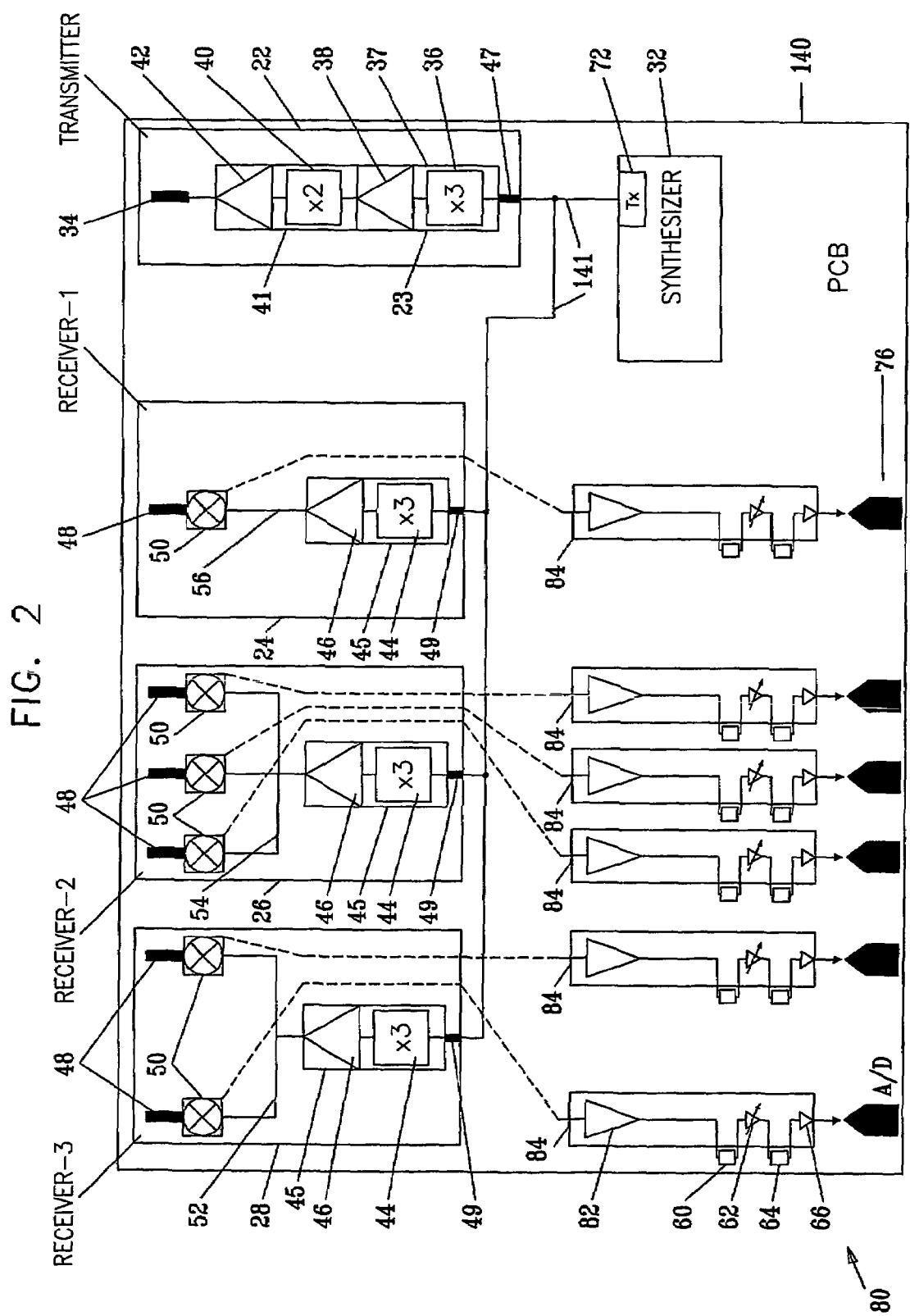
FIG. 2 is a schematic block diagram of an alternative millimeter wave multiple beam transceiver, according to a preferred embodiment of the present invention.

FIG. 2 is a schematic block diagram of a millimeter wave multiple beam transceiver 80, according to a preferred embodiment of the present invention. Apart from the differences described below, the operation of transceiver 80 is generally similar to that of transceiver 20 (FIG. 1), so that elements indicated by the same reference numerals in both transceivers 80 and 20 are generally identical in construction and in operation. In contrast to transceiver 20, receivers 24, 26, and 28 in transceiver 80 operate as homodyne receivers. Thus, synthesizer 32 is implemented to only produce a single frequency, which is effectively multiplied by a factor of six in transmitter 22, as described above. In receiver modules 24, 26, and 28 the single frequency is multiplied by a factor of three, and this x3 frequency acts as a fundamental frequency when it is coupled to mixers 50. As for transceiver 20, the mixers function both as mixers and as second harmonic producers of the fundamental frequency. In transceiver 80, the second harmonic frequency generated by each mixer 50 is substantially equal to the center frequency transmitted by transmitter 22.

Mixers 50 thus operate as homodyne mixers, generating substantially down-converted base-band frequencies. In contrast to IF receiver blocks 30, receiver blocks 84 are therefore implemented to operate as base-band receivers, and consequently do not require a separate mixer (mixer 58) in order to generate base-band signals. Each receiver block 84 comprises a base-band amplifier 82, most preferably a low noise amplifier, which generates a base-band output similar to that generated by mixer 58 of transceiver 20. The base-band signal is then processed by elements 60, 62, 64, and 66, and A/D 76, substantially as described for transceiver 20.

It will be appreciated that transceiver 80 requires fewer components than transceiver 20, by virtue of operating in a homodyne mode. However 1/f noise generated in mixers 50 in transceiver 80 may be relatively high compared to 1/f noise generated in mixers 50 in transceiver 20, since the mixer output is effectively at base-band frequencies in the homodyne transceiver, compared to IF values of approximately 2 GHz in the heterodyne transceiver. To overcome this, the power output from transmitter module 22 in transceiver 80 may be increased compared to that of transceiver 20, so as to overcome the increased 1/f noise. Other methods for compensating for the 1/f noise are also known in the art.

Figure 3:
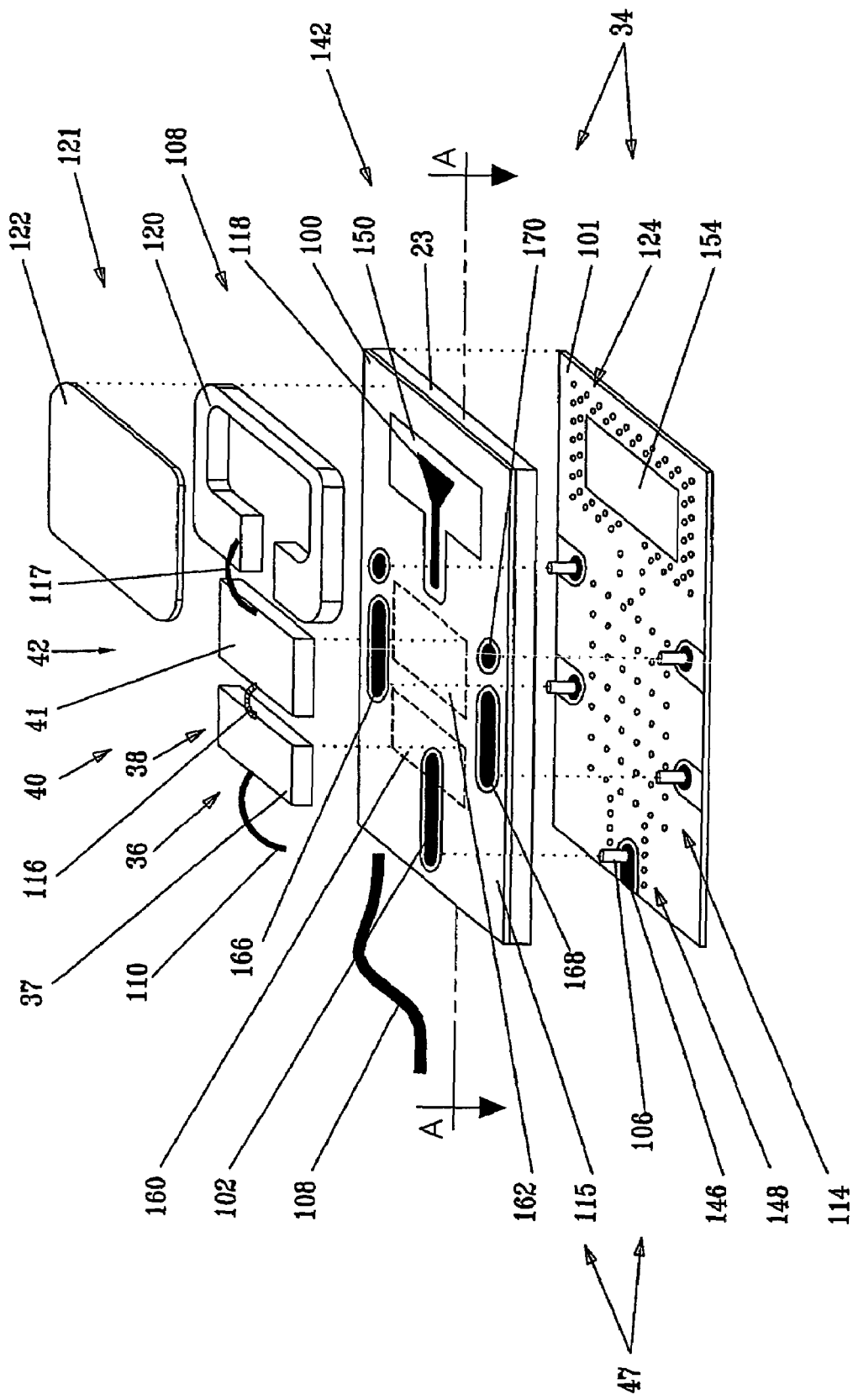
FIG. 3 is a schematic exploded drawing of a transmitter module of the transceiver of FIG. 1 or 2, according to a preferred embodiment of the present invention.
Figure 4:
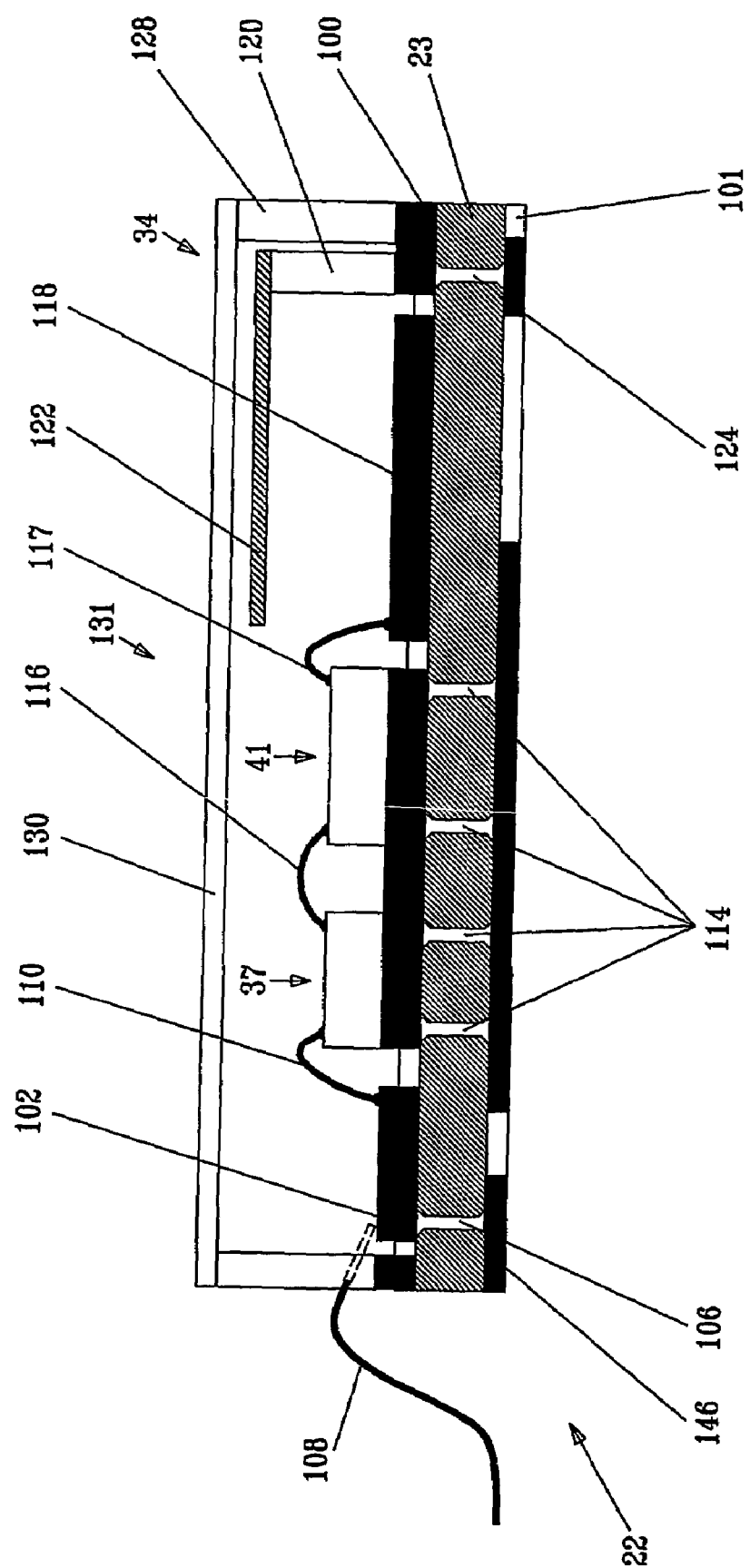
FIG. 4 is a schematic cross-section of the transmitter module of FIG. 3, according to a preferred embodiment of the present invention.
Figure 5:
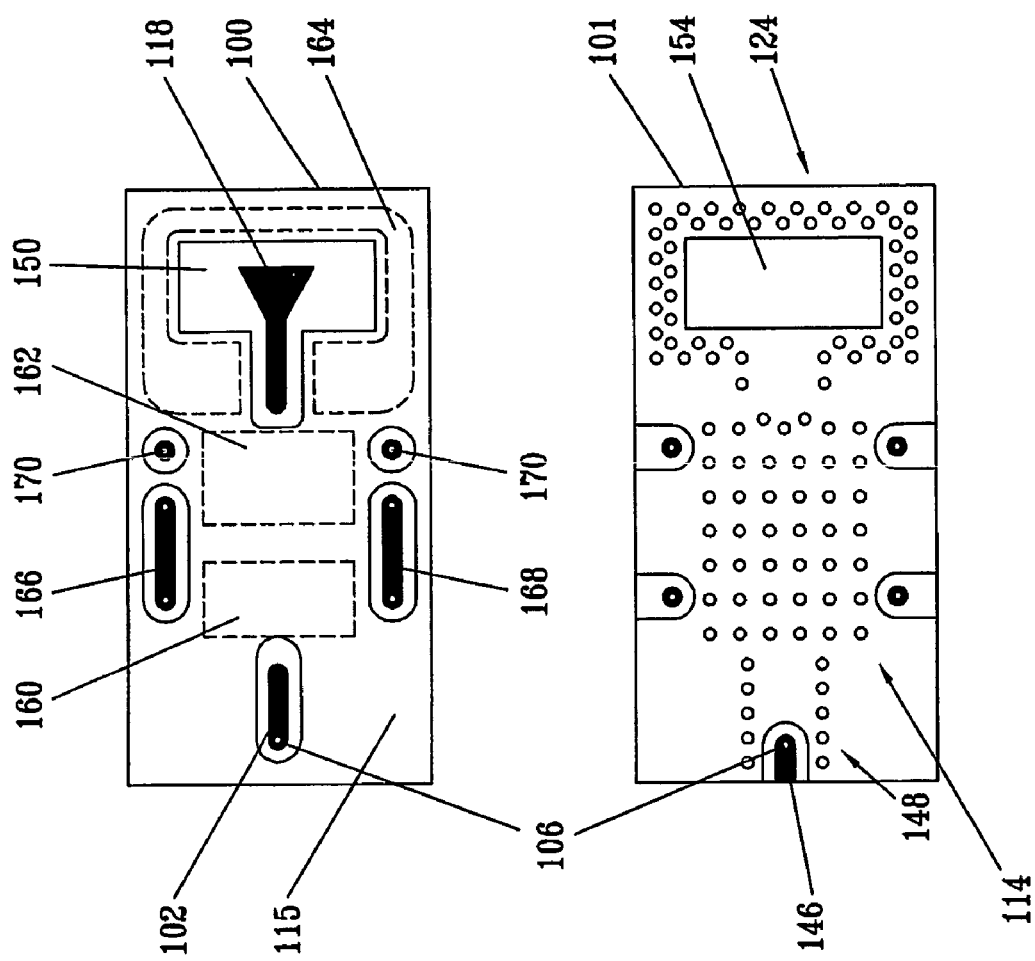
FIG. 5 is a schematic diagram of conducting layers of the transmitter module of FIG. 3.

FIG. 3 is a schematic exploded drawing of transmitter module 22, FIG. 4 is a schematic cross-section of the module, and FIG. 5 illustrates structure of surfaces within the module, according to a preferred embodiment of the present invention. Transmitter module 22 is formed by mounting components on a base 142. Base 142 comprises dielectric substrate 23, having an upper conducting layer 100 and a lower conducting layer 101. The dielectric substrate and its upper conducting layer act as a mounting plate for the components of transmitter module 22. A similar base is advantageously also used as a foundation for receiver modules 24, 26, and 28. Regions of layers 100, 101, are removed from the layers to accommodate mounting of elements on base 142, and also to form elements within the base, as is described in more detail below.

Base 142 comprises microstrip-microstrip transition 47 and microstrip-waveguide transition 34. In layer 101 a first central hot microstrip section 146 is formed. Section 146 is connected to a second central hot microstrip section 102, which is formed as a generally linear "island" in layer 100. Section 102 is connected to section 146 by a transition "hot" via 106 penetrating dielectric 23. A ground path for transition 47 is provided by vias 148, which form a pattern around hot via 106, and which also penetrate dielectric 23. For clarity, only ends of vias, apart from via 106, are shown in FIGS. 3, 4, and 5. Vias 148 connect conducting layer 101 to a grounding shield 115 formed in conducting layer 100, and are positioned so they do not contact island section 102.

Microstrip-waveguide transition 34 is formed by removing a generally T-shaped section 150 of layer 100, while leaving a generally Y-shaped conducting section 118 in the center of insulating section 150. Section 118 acts as a central radiator of transition 34. Around the "head" of section 150 are formed a plurality of vias 124 which couple layers 101 and 100. Within layer 101 a generally rectangular opening 154 is formed, aligned with the head of T-shaped section 150.

Transition 34 most preferably further comprises a "back short" 121, comprising a conducting generally "U" shaped element 120 with a lid 122 on the U-shaped element. The back short is dimensioned and positioned to act as a coherent reflector of mm waves, and prevents unwanted radiation leaking from transition 34 into the transmitter. Most preferably, back short 121 is formed as an MIC component, which is coupled to a mating U-shaped region 164 formed on layer 100 of dielectric 23. Layer 100 also comprises generally rectangular shaped regions 160 and 162, the regions being used for mounting of components 37 and 41 of transmitter module 22. Layer 100 further comprises pads 166 and 168, insulated from shield 115, which are used to couple DC levels to the components of the transmitter module.

Transmitter module 22 also comprises a plurality of ground-ground vias 114 coupling ground shield 115 to lower conducting layer 101. Ground-ground vias 114 penetrate substrate 23 and act both as heat dissipaters and mode suppressors.

Component 37 receives its LF input from an inert wire bond 110, preferably a gold wire, which is coupled to microstrip section 102. Section 102 is optionally coupled by a tab 108 to microstrip line 141 of PCB 140, in which case section 146 of transition 47 may not be used. The output of component 37 is transferred to component 41 by an inert wire bond 116. The mm wave output from component 41 is coupled by an inert wire bond 117 to central section 118 of transition 109. Power to components 37 and 41 is provided by connecting inert bonds from pads 166 and 168 to the components.

Transmitter module 22 most preferably has a covering 131 (only shown in FIG. 4, for clarity), comprising a housing wall 128 covered by a housing lid 130, mounted onto layer 100, the covering serving to protect the transmitter. The covering also prevents radiation leaking from or entering the transmitter.

Receiver modules 24, 26, and 28 are implemented with substantially similar techniques to those used for transmitter module 22. For all receiver modules, individual components of the modules are mounted on a base substantially similar to base 142, and the components receive low frequency signals from their respective microstrip-microstrip transitions 49, and mm wave signals from their respective microstrip-waveguide transitions 48. By way of example, implementation of receiver module 24 on base 142 is described hereinbelow.

Receiver module 24 comprises MIC components 45 and 50, which are respectively mounted on regions 160 and 162 of base 142. Components 45 and 50 are coupled substantially as described above for components of transmitter module 22, so that receiver module 24 receives its LF input from section 102, and components 45 and 50 are powered from pads 166 and 168. In addition, the output of receiver module 24 is taken from mixer 50 to a pad 170, and from pad 170 the mixer output is connected to the input of IF receiver block 30 (FIG. 1).

Receiver modules comprising sub-receivers, such as receiver module 28 and receiver module 26, are constructed in a substantially similar manner to receiver module 24, except for differences stated below. Components of such receiver modules are most preferably mounted on bases which generally similar to base 142, but are modified to accommodate the extra elements comprised in the multiple sub-receivers. For example, in the case of receiver module 28, two mixers may be integrated into one IC, and the single IC positioned in region 162. The modified base for receiver module 28 also comprises two microstrip-waveguide transitions 8, each substantially similar to transition 34. The outputs of the two mixers are transferred via separate pads 170.

Receiver modules 24, 26, and 28 most preferably have a covering substantially similar to covering 131 coupled to their upper layer, to serve as a protecting cover for the receiver.

Figure 6:
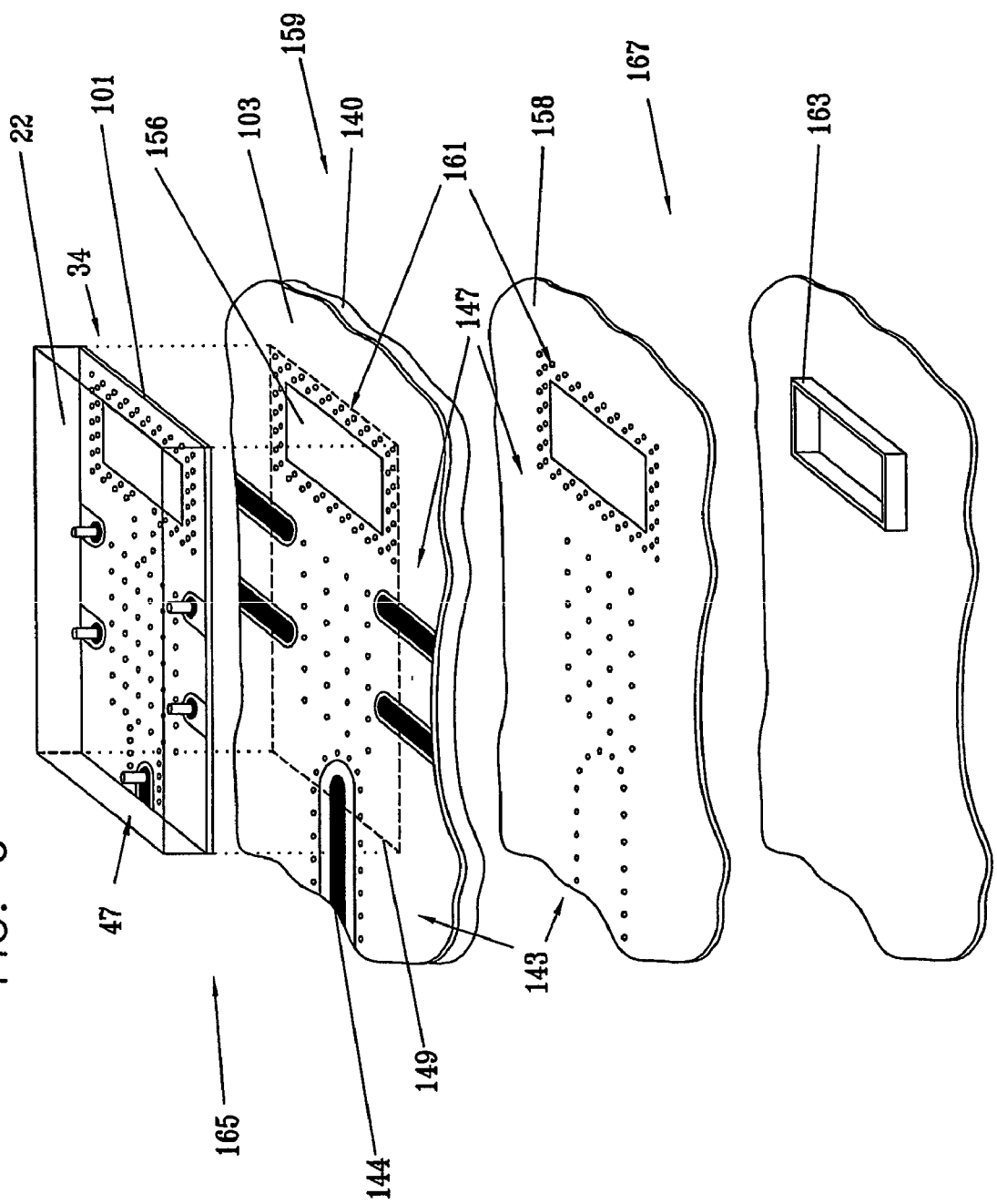
FIG. 6 is a schematic diagram of a section of a printed circuit board of the transceiver of FIG. 1 or 2, according to a preferred embodiment of the present invention.

FIG. 6 is a schematic perspective diagram of a section of PCB 140, illustrating coupling of the PCB to transmitter module 22, according to a preferred embodiment of the present invention. PCB 140 comprises an upper layer 103 and a lower layer 158. PCB 140 comprises a rectangular opening 156, which is optionally plated through. Alternatively or additionally, opening 156 is surrounded by waveguide forming vias 161, penetrating the PCB. Thus, opening 156 together with vias 161 forms a waveguide aperture 159 in the PCB. For clarity, only the ends of vias in PCB 140 are shown in FIG. 6.

PCB 140 also comprises a microstrip line 144 formed in layer 103, line 144 corresponding to the part of microstrip line 141 (FIG. 1) coupled to transmitter module 22. Microstrip line 144 is surrounded by grounding vias 143. Vias 147 in PCB 140 act as heat transfer and mode suppressing vias.

In assembling transceiver 20 or transceiver 80, transmitter module 22 is aligned and connected with a landing area 149, so that waveguide aperture 159 aligns with microstrip-waveguide transition 34, so forming a waveguide-waveguide transition 167. Similarly, microstrip line 144 aligns with microstrip 146 of microstrip-microstrip transition 47, forming a microstrip-microstrip transition 165 which couples line 141 of PCB 140 and microstrip section 102 of transmitter module 22. Alternatively, if tab 108 is implemented, it connects section 102 to microstrip line 144. Thus, since waveguide-waveguide transition 163 and microstrip-microstrip transition 165, or the use of tab 108, require relatively low tolerances, transmitter module 22 may be simply coupled to PCB 140.

A waveguide 163 is coupled to a section of layer 158 surrounding opening 156, the waveguide leading to a transmit antenna (not shown in FIG. 6).

Receiver modules 24, 26, and 28, are coupled to PCB 140 in substantially the same manner as described for transmitter module 22. For each receiver module, a landing area is outlined in PCB 140, and the module is aligned and connected with the landing area. Each receiver module coupling to PCB 140 thus forms a single microstrip-microstrip transition similar to microstrip-microstrip transition 165. Each receiver or sub-receiver within a receiver module also forms a single waveguide-waveguide transition similar to waveguide-waveguide transition 167 for each receiving unit. As for the transmitter module, all transitions for the receiver modules require relatively low tolerances, so that transceiver 20 or 80 may be easily and simply implemented.

It will be appreciated that the preferred embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

What is claimed is:

1. A transceiver for a millimeter wave signal, comprising:
   a printed circuit board (PCB), comprising PCB microstrip lines and PCB waveguide apertures;
   one or more transmitter modules mounted on the PCB, each transmitter module comprising:
      a single transmit microstrip-waveguide transition adapted to convey millimeter waves and coupled to one of the PCB waveguide apertures so as to form a transmit waveguide-waveguide transition;
      a transmit microstrip-microstrip transition coupled to one of the PCB microstrip lines so as to form a PCB-transmitter module microstrip-microstrip transition; and
      transmit active components coupled to receive a first reference frequency from the PCB-transmitter module microstrip-microstrip transition, to generate the millimeter wave signal therefrom, and to transmit the millimeter wave signal via the transmit waveguide-waveguide transition; and
   one or more receiver modules mounted on the PCB, each receiver module comprising:
      a single receive microstrip-waveguide transition adapted to convey millimeter waves and coupled to one of the PCB waveguide apertures so as to form a receive waveguide-waveguide transition;
      a receive microstrip-microstrip transition coupled to one of the PCB microstrip lines so as to form a PCB-receiver module microstrip-microstrip transition;
      an output port; and
      receive active components coupled to receive a second reference frequency from the PCB-receiver module microstrip-microstrip transition, to receive the millimeter wave signal from the waveguide-waveguide transition, to generate a down-converted signal in response to the second reference frequency and the millimeter wave signal, and to transfer the down-converted signal via the output port.

2. A transceiver according to claim 1, wherein the receive active components comprise:
   a frequency multiplier that multiplies the second reference frequency to produce a sub-harmonic of a millimeter wave frequency; and
   a mixer that receives the millimeter wave signal and the sub-harmonic and generates the millimeter wave frequency therefrom as a local oscillator frequency, and that generates the down-converted signal in response to the local oscillator frequency and the millimeter wave signal.

3. A transceiver according to claim 1, wherein at least one of the receiver modules comprises a second receive microstrip-waveguide transition adapted to convey millimeter waves and coupled to a second of the PCB waveguide apertures so as to form a second receive waveguide-waveguide transition.

4. A transceiver according to claim 3, wherein the millimeter wave signal comprises a first millimeter wave signal and a second millimeter wave signal, and wherein the down-converted signal comprises a first down-converted signal and a second down-converted signal, wherein the receive active components comprise:
   a frequency multiplier that multiplies the second reference frequency to produce a sub-harmonic of a millimeter wave frequency;
   a first mixer that receives the first millimeter wave signal and the sub-harmonic and generates the millimeter wave frequency therefrom as a local oscillator frequency, and that generates the first down-converted signal in response to the local oscillator frequency and the first millimeter wave signal; and
   a second mixer that receives the second millimeter wave signal and the sub-harmonic and generates the millimeter wave frequency therefrom as a local oscillator frequency, and that generates the second down-converted signal in response to the local oscillator frequency and the second millimeter wave signal.

5. A transceiver according to claim 4, and comprising a coupling between the frequency multiplier and the first and second mixers that rejects frequencies substantially similar to a frequency of the millimeter wave signal.

6. A transceiver according to claim 1, wherein at least one transmitter module comprises a transmit dielectric substrate which retains the transmit active components, and wherein at least one receiver module comprises a receiver dielectric substrate which retains the receiver active components, and wherein the transmit and receive dielectric substrates comprise substantially similar dimensions.

7. A transceiver according to claim 1, wherein at least one transmitter module comprises:
   a transmit short adapted to act as a coherent reflector for the transmit microstrip-waveguide transition; and
   a transmit dielectric substrate which retains the transmit active components and the transmit short using microwave integrated circuit (MIC) technology.

8. A transceiver according to claim 1, wherein at least one receiver module comprises:
   a receive short adapted to act as a coherent reflector for the receive microstrip-waveguide transition; and
   a receive dielectric substrate which retains the receive active components and the receive short using MIC technology.

9. A transceiver according to claim 1, wherein at least one transmitter module comprises:
   a transmit dielectric substrate which retains the transmit active components;
   a transmit microstrip line; and
   ground vias which penetrate the transmit dielectric substrate,
   and wherein the transmit microstrip-microstrip transition comprises the ground vias and the transmit microstrip line.

10. A transceiver according to claim 1, wherein at least one receiver module comprises:
    a receive dielectric substrate which retains the receive active components;
    a receive microstrip line; and
    ground vias which penetrate the receive dielectric substrate,
    and wherein the receive microstrip-microstrip transition comprises the ground vias and the receive microstrip line.

11. A transceiver according to claim 1, wherein at least one transmitter module comprises:
    a transmit dielectric substrate which retains the transmit active components;

a transmit waveguide opening in the transmit dielectric substrate; and waveguide vias which penetrate the transmit dielectric substrate, and wherein the transmit microstrip-waveguide transition comprises the transmit waveguide opening and the waveguide vias.

12. A transceiver according to claim 1, wherein at least one receiver module comprises:

a receive dielectric substrate which retains the transmit active components;

a receive waveguide opening in the receive dielectric substrate; and waveguide vias which penetrate the receive dielectric substrate, and wherein the receive microstrip-waveguide transition comprises the receive waveguide opening and the waveguide vias.

13. A transceiver according to claim 1, wherein at least one PCB waveguide aperture comprises:

a PCB waveguide opening in the PCB; and waveguide vias which penetrate the PCB and surround the PCB waveguide opening.

14. A transceiver according to claim 1, wherein at least one PCB microstrip line comprises:

a center microstrip line in the PCB; and ground vias which penetrate the PCB and surround the PCB center microstrip line.

15. A method for transmitting and receiving a millimeter wave signal, comprising:

forming in a printed circuit board (PCB) PCB microstrip lines and PCB waveguide apertures;

mounting one or more transmitter modules on the PCB, each transmitter module comprising:

a single transmit microstrip-waveguide transition adapted to convey millimeter waves and coupled to one of the PCB waveguide apertures so as to form a transmit waveguide-waveguide transition;

a transmit microstrip-microstrip transition coupled to one of the PCB microstrip lines so as to form a PCB-transmitter module microstrip-microstrip transition; and transmit active components coupled to receive a first reference frequency from the PCB-transmitter module microstrip-microstrip transition, to generate the millimeter wave signal therefrom, and to transmit the millimeter wave signal via the transmit waveguide-waveguide transition; and mounting one or more receiver modules on the PCB, each receiver module comprising:

a single receive microstrip-waveguide transition adapted to convey millimeter waves and coupled to one of the PCB waveguide apertures so as to form a receive waveguide-waveguide transition;

a receive microstrip-microstrip transition coupled to one of the PCB microstrip lines so as to form a PCB-receiver module microstrip-microstrip transition;

an output port; and receive active components coupled to receive a second reference frequency from the PCB-receiver module microstrip-microstrip transition, to receive the millimeter wave signal from the waveguide-waveguide transition, to generate a down-converted signal in response to the second reference frequency and the millimeter wave signal, and to transfer the down-converted signal via the output port.

16. A method according to claim 15, wherein the receive active components comprise:

a frequency multiplier that multiplies the second reference frequency to produce a sub-harmonic of a millimeter wave frequency; and a mixer that receives the millimeter wave signal and the sub-harmonic and generates the millimeter wave frequency therefrom as a local oscillator frequency, and that generates the down-converted signal in response to the local oscillator frequency and the millimeter wave signal.

17. A method according to claim 15, wherein at least one of the receiver modules comprises a second receive microstrip-waveguide transition adapted to convey millimeter waves and coupled to a second of the PCB waveguide apertures so as to form a second receive waveguide-waveguide transition.

18. A method according to claim 17, wherein the millimeter wave signal comprises a first millimeter wave signal and a second millimeter wave signal, and wherein the down-converted signal comprises a first down-converted signal and a second down-converted signal, wherein the receive active components comprise:

a frequency multiplier that multiplies the second reference frequency to produce a sub-harmonic of a millimeter wave frequency;

a first mixer that receives the first millimeter wave signal and the sub-harmonic and generates the millimeter wave frequency therefrom as a local oscillator frequency, and that generates the first down-converted signal in response to the local oscillator frequency and the first millimeter wave signal; and a second mixer that receives the second millimeter wave signal and the sub-harmonic and generates the millimeter wave frequency therefrom as a local oscillator frequency, and that generates the second down-converted signal in response to the local oscillator frequency and the second millimeter wave signal.

19. A method according to claim 18, and comprising a coupling between the frequency multiplier and the first and second mixers that rejects frequencies substantially similar to a frequency of the millimeter wave signal.

20. A method according to claim 15, wherein at least one transmitter module comprises a transmit dielectric substrate which retains the transmit active components, and wherein at least one receiver module comprises a receiver dielectric substrate which retains the receiver active components, and wherein the transmit and receive dielectric substrates comprise substantially similar dimensions.

21. A method according to claim 15, wherein at least one transmitter module comprises:

a transmit short adapted to act as a coherent reflector for the transmit microstrip-waveguide transition; and a transmit dielectric substrate which retains the transmit active components and the transmit short using microwave integrated circuit (MIC) technology.

22. A method according to claim 15, wherein at least one receiver module comprises:

a receive short adapted to act as a coherent reflector for the receive microstrip-waveguide transition; and a receive dielectric substrate which retains the receive active components and the receive short using MIC technology.

23. A method according to claim 15, wherein at least one transmitter module comprises:

a transmit dielectric substrate which retains the transmit active components;

a transmit microstrip line; and ground vias which penetrate the transmit dielectric substrate, and wherein the transmit microstrip-microstrip transition comprises the ground vias and the transmit microstrip line.

24. A method according to claim 15, wherein at least one receiver module comprises:

a receive dielectric substrate which retains the receive active components;

a receive microstrip line; and ground vias which penetrate the receive dielectric substrate, and wherein the receive microstrip-microstrip transition comprises the ground vias and the receive microstrip line.

25. A method according to claim 15, wherein at least one transmitter module comprises:

a transmit dielectric substrate which retains the transmit active components;

a transmit waveguide opening in the transmit dielectric substrate; and waveguide vias which penetrate the transmit dielectric substrate, and wherein the transmit microstrip-waveguide transition comprises the transmit waveguide opening and the waveguide vias.

26. A method according to claim 15, wherein at least one receiver module comprises:

a receive dielectric substrate which retains the transmit active components;

a receive waveguide opening in the receive dielectric substrate; and waveguide vias which penetrate the receive dielectric substrate, and wherein the receive microstrip-waveguide transition comprises the receive waveguide opening and the waveguide vias.

27. A method according to claim 15, wherein at least one PCB waveguide aperture comprises:

a PCB waveguide opening in the PCB; and waveguide vias which penetrate the PCB and surround the PCB waveguide opening.

28. A method according to claim 15, wherein at least one PCB microstrip line comprises:

a center microstrip line in the PCB; and ground vias which penetrate the PCB and surround the PCB center microstrip line.

* * * * *